(12) United States Patent
Kohut

(10) Patent No.: US 6,931,135 B1
(45) Date of Patent: Aug. 16, 2005

(54) FREQUENCY DEPENDENT EXCURSION LIMITER

(75) Inventor: Paul Kohut, Napa, CA (US)

(73) Assignee: Meyer Sound Laboratories, Incorporated, Berkeley, CA (US)

( * ) Notice: Subject to any disclaimer, the term of this patent is extended or adjusted under 35 U.S.C. 154(b) by 837 days.

(21) Appl. No.: 09/974,778

(22) Filed: Oct. 9, 2001

Related U.S. Application Data

(60) Provisional application No. 60/239,013, filed on Oct. 6, 2000.

(51) Int. Cl.[7] .......................... H03G 11/00; H03G 5/00; H04R 29/00
(52) U.S. Cl. .......................... 381/55; 381/59; 381/100
(58) Field of Search .......................... 381/55, 56, 57, 381/58, 59, 96, 100, 94.8, 94.9, 108; 330/298, 330/207 A; 327/309, 317

(56) References Cited

U.S. PATENT DOCUMENTS

| | | | |
|---|---|---|---|
| 4,173,740 A | | 11/1979 | Nagata et al. |
| 4,296,278 A | * | 10/1981 | Cullison et al. ............... 381/55 |
| 4,583,245 A | * | 4/1986 | Gelow et al. .................. 381/59 |
| 4,875,546 A | | 10/1989 | Krnan |
| 5,170,435 A | | 12/1992 | Rosen et al. |
| 5,418,860 A | * | 5/1995 | Daniels ....................... 381/400 |
| 5,448,646 A | * | 9/1995 | Lucey et al. .................. 381/74 |
| 5,729,611 A | * | 3/1998 | Bonneville .................... 381/55 |
| 6,201,873 B1 | * | 3/2001 | Dal Farra .................... 381/100 |

* cited by examiner

Primary Examiner—Sinh Tran
Assistant Examiner—Devona E. Faulk
(74) Attorney, Agent, or Firm—Donald L. Beeson

(57) ABSTRACT

A circuit and method provides for the protection of transducers from over excursion, particularly for the protection of transducers for audio loudspeakers. A frequency dependent excursion limiter circuit has an initial summing stage followed by a shaping filter stage. A clamping function is provided at the summing stage, or at a separate stage between the summing stage and the shaping filter stage, for clamping the driving signal at a predetermined maximum voltage if the driving signal exceeds the predetermined maximum voltage level. The shaping filter stage provides a frequency response shaping function based on a predetermined frequency response shaping criteria which is related to the frequency dependent excursion limits of the transducers being protected from mechanical overload. An inverse shaping filter function is provided at the initial summing stage by providing feedback from the shaping filter stage, thus eliminating the need for a separate inverse shaping filter circuit before clamping. The inverse shaping filter function allows low level signals below clamping to pass through the circuit unaffected.

A frequency dependent excursion limiter circuit is also provided in the closed loop circuit of servo feedback system for protecting transducers in a servo feedback system from over excursion.

23 Claims, 9 Drawing Sheets

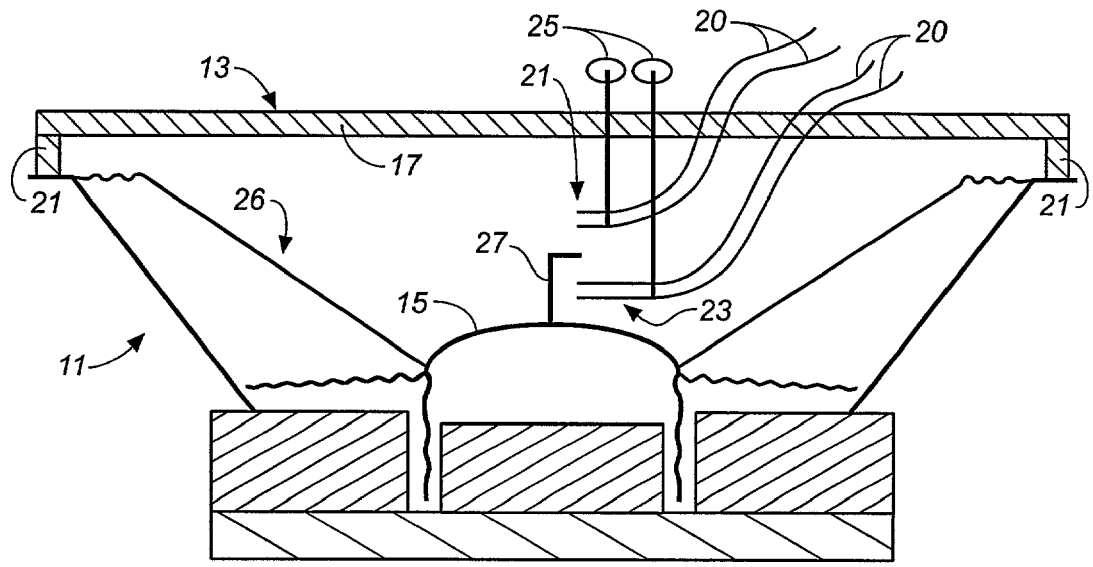
FIG._1
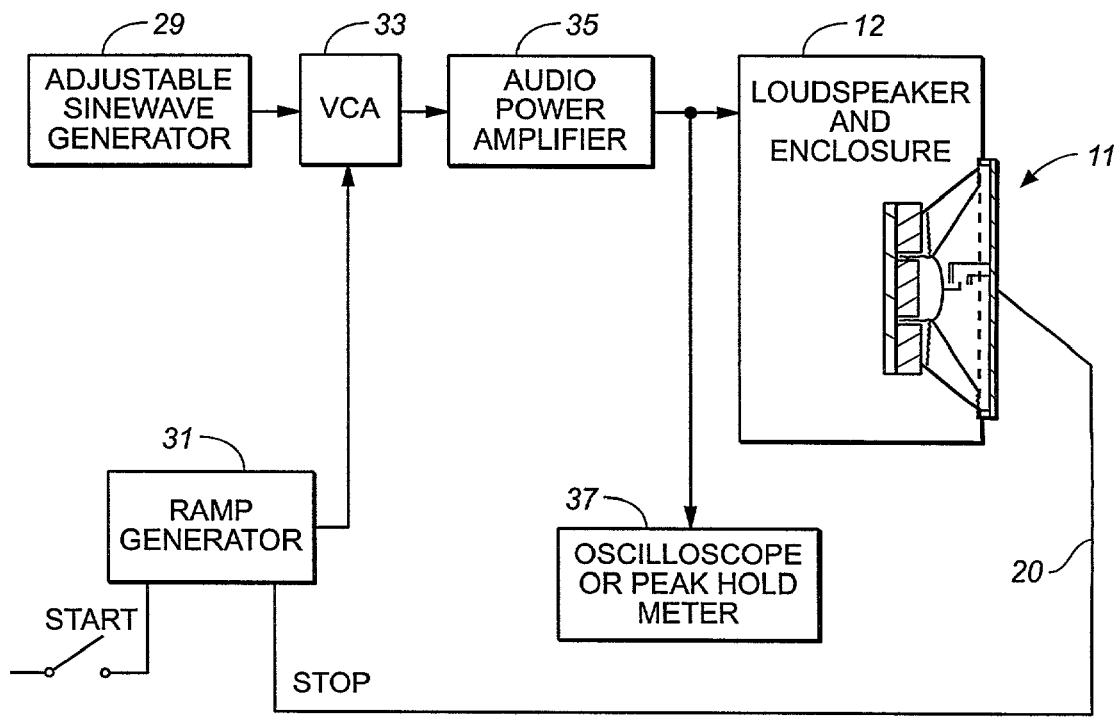
FIG._2

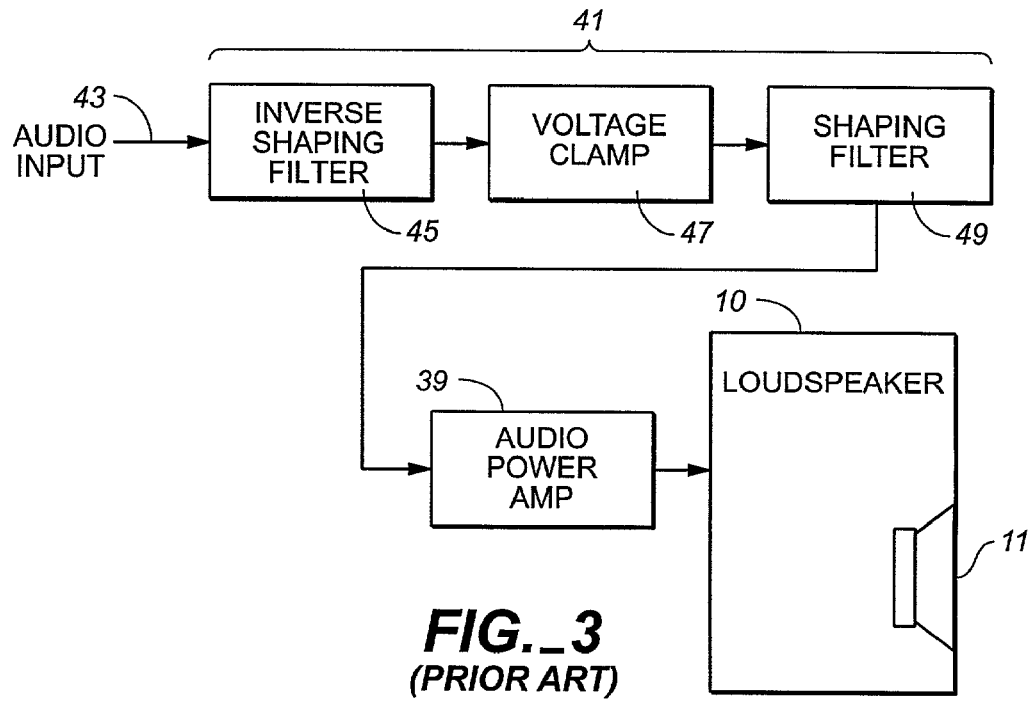
FIG._3
*(PRIOR ART)*
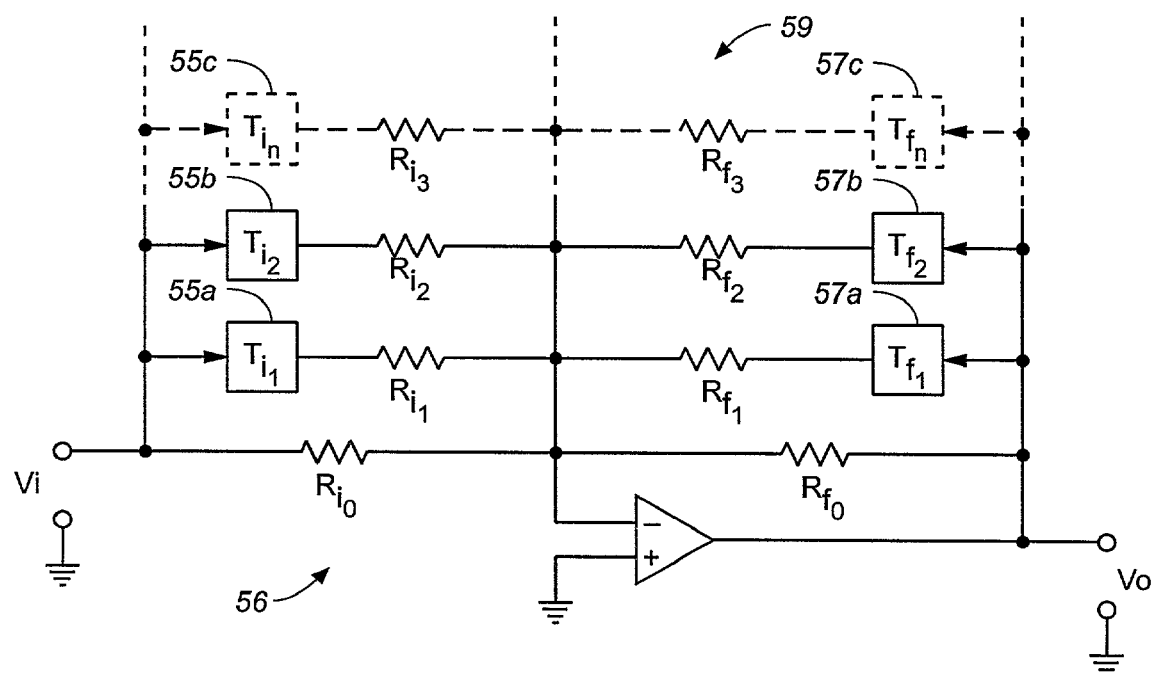
FIG._4

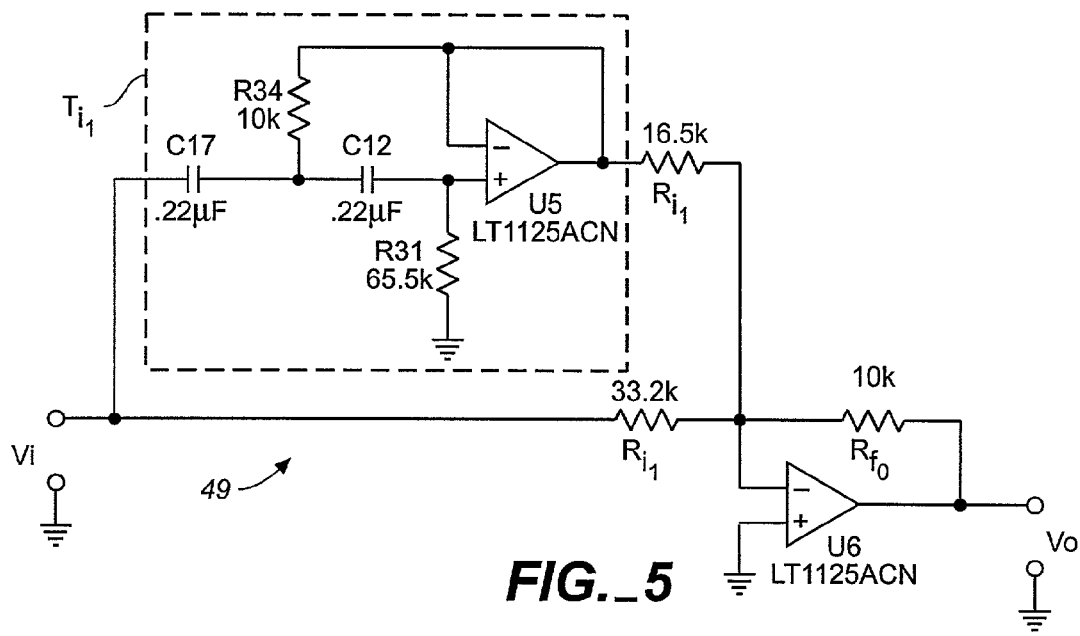
FIG._5
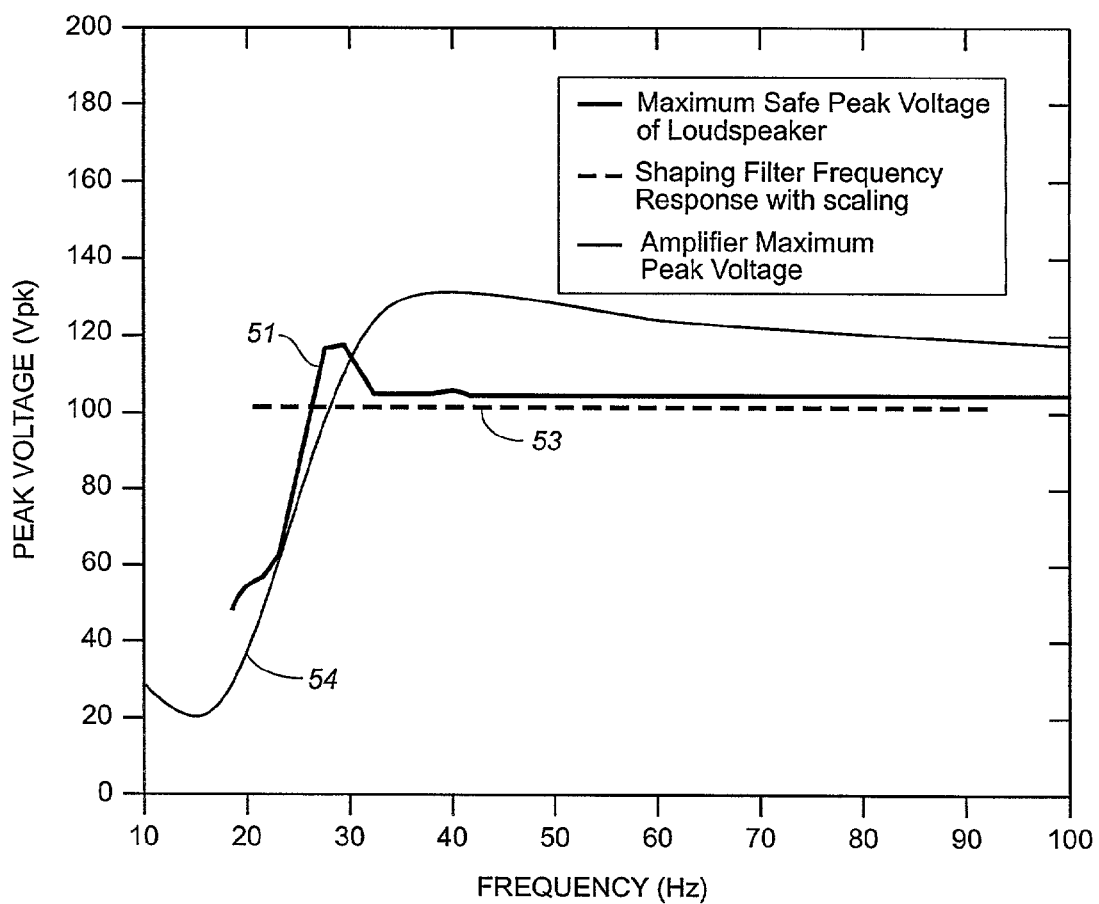
FIG._6

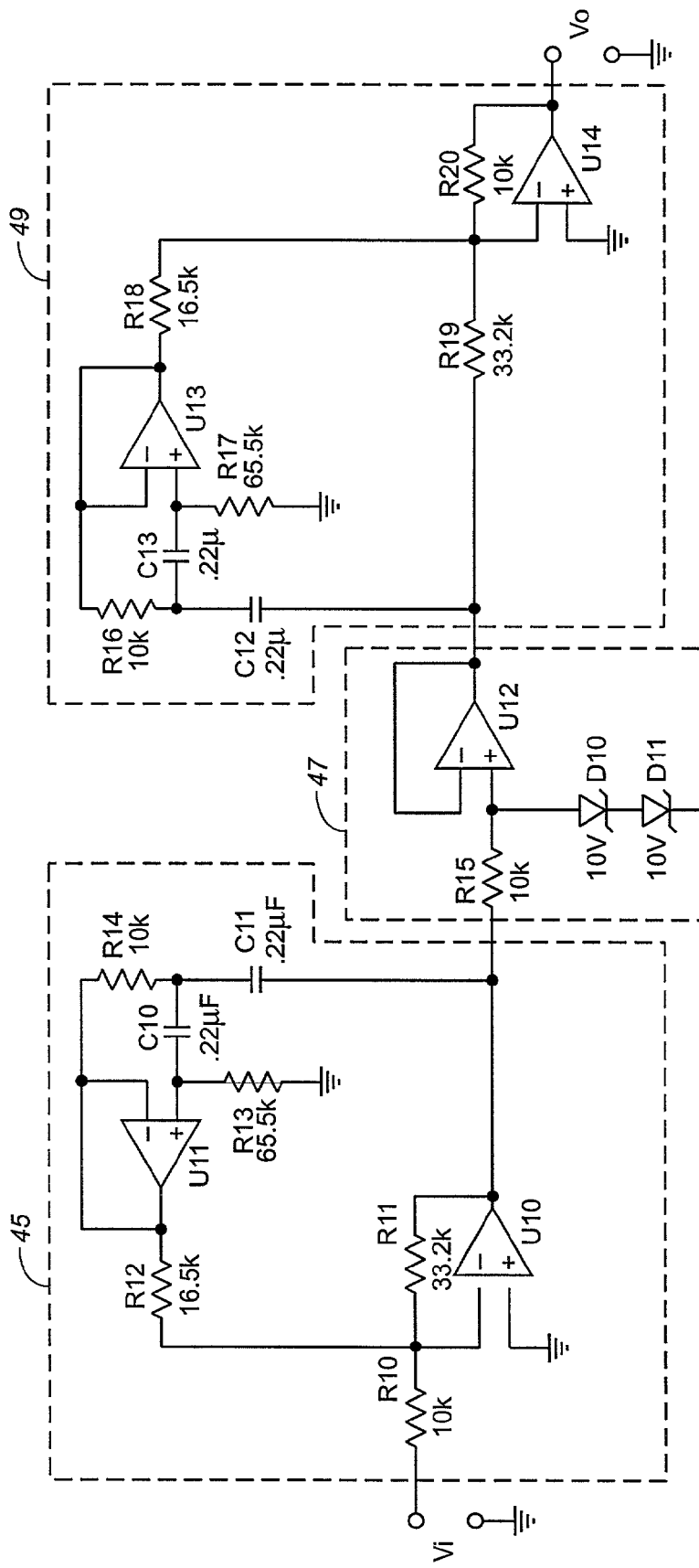
FIG._7

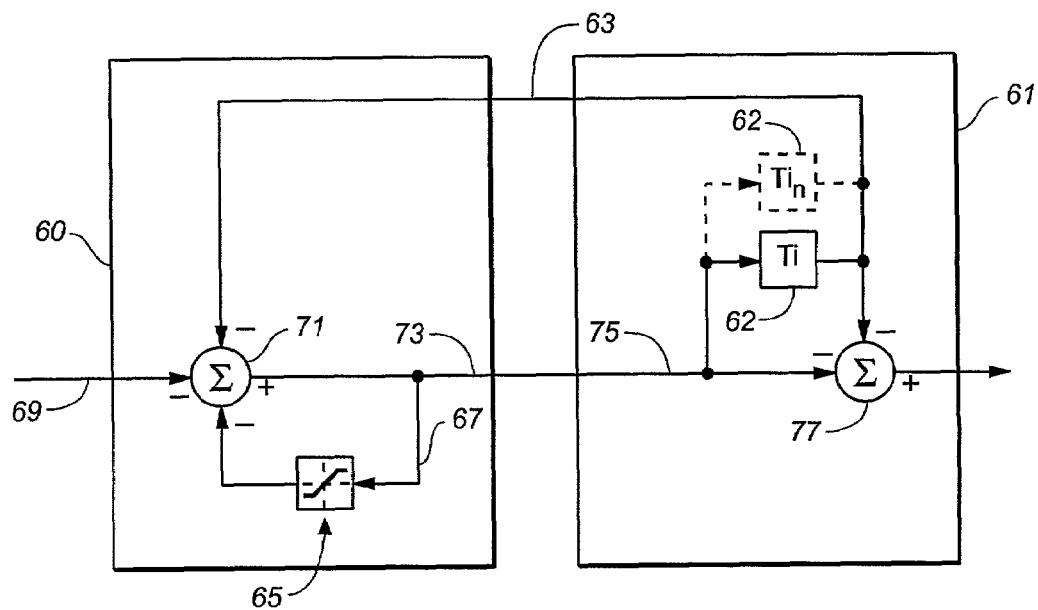
FIG._8
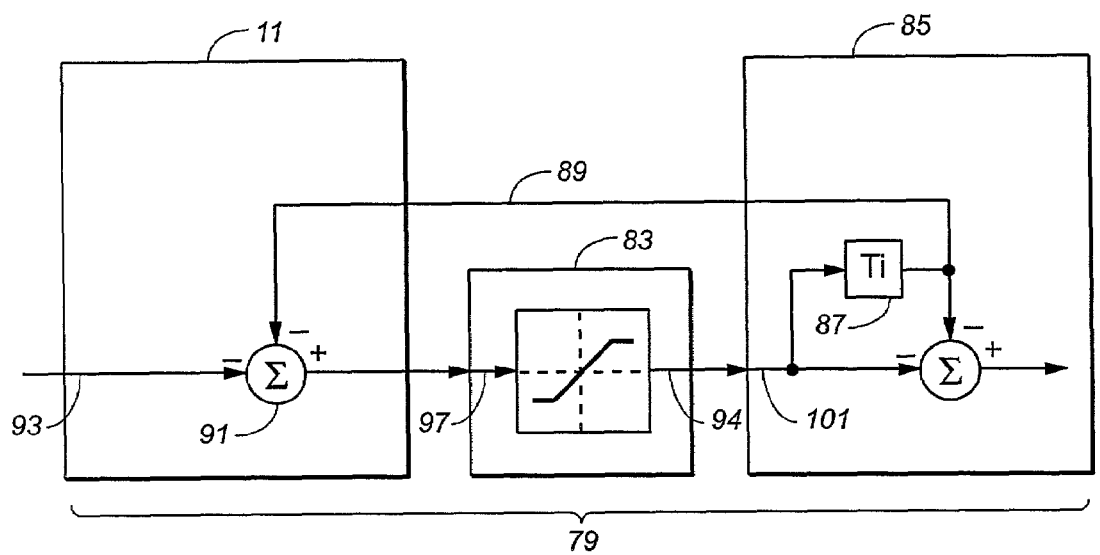
FIG._9

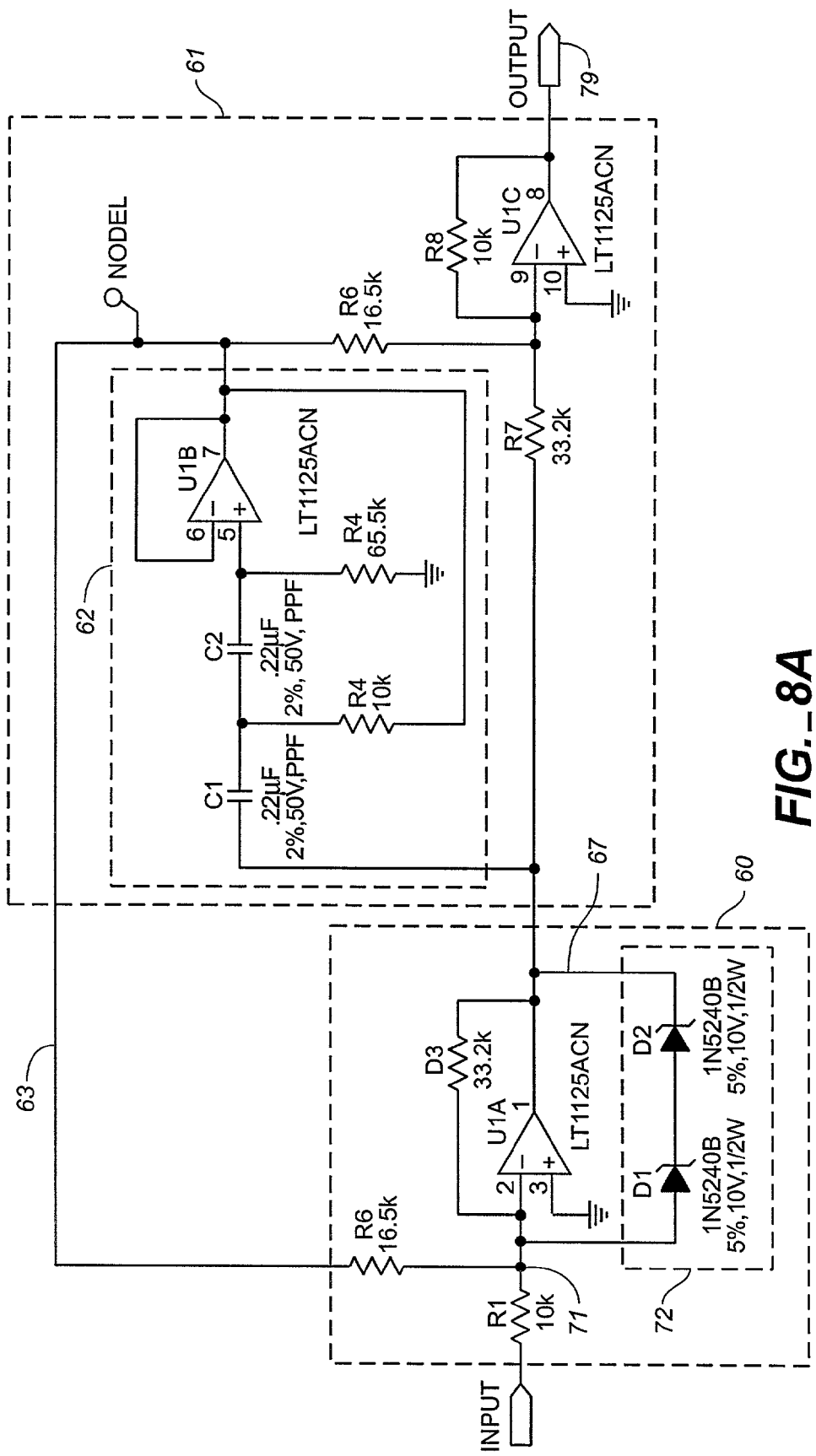
FIG._8A

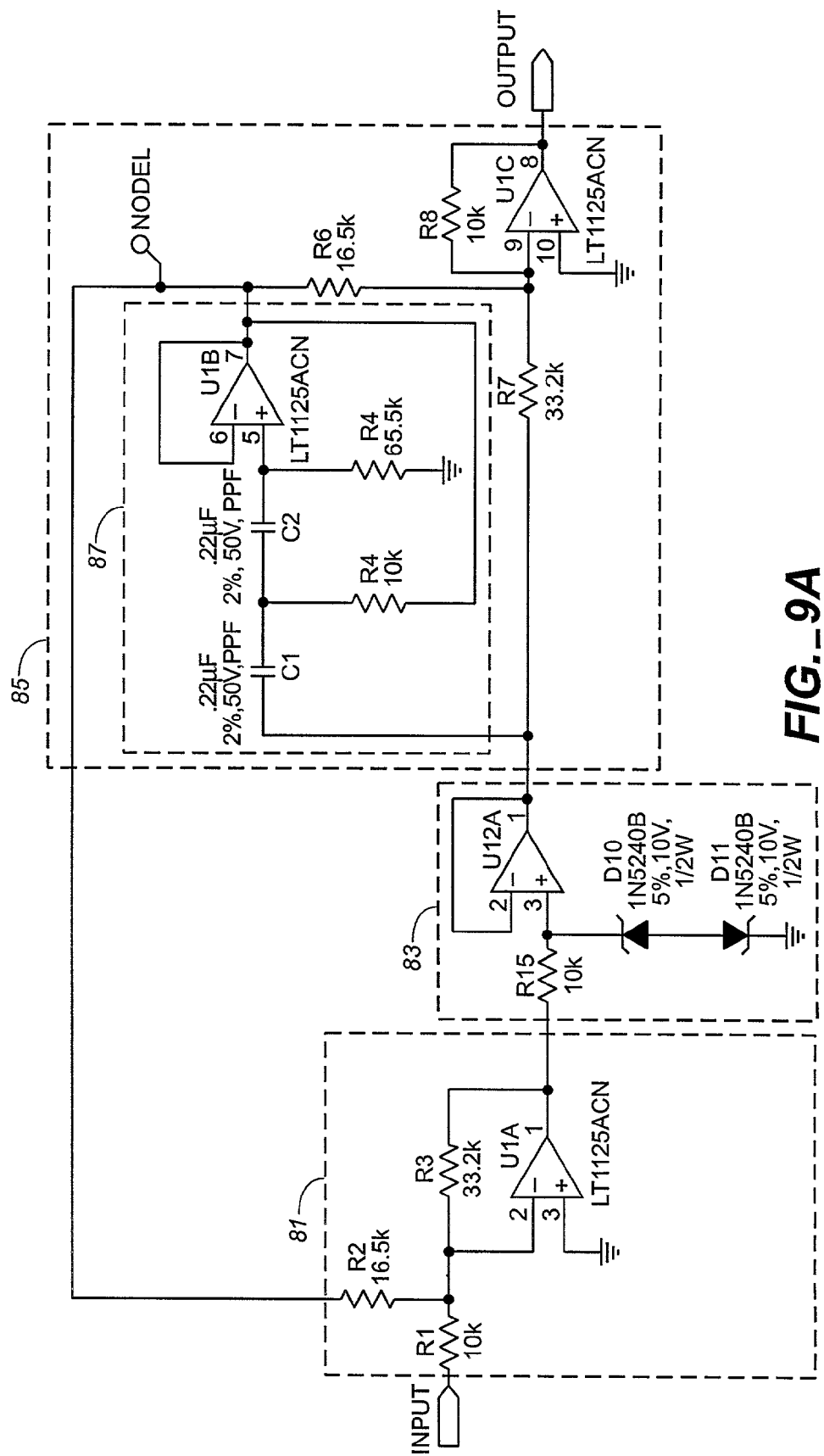
FIG._9A

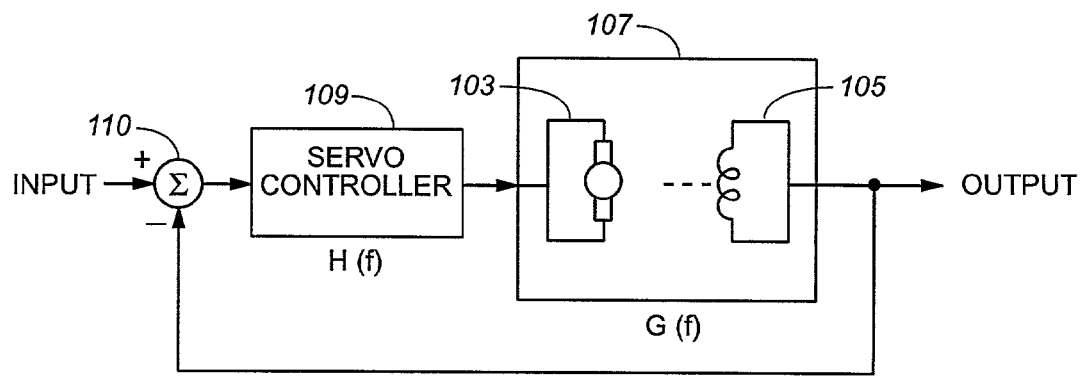
FIG._10
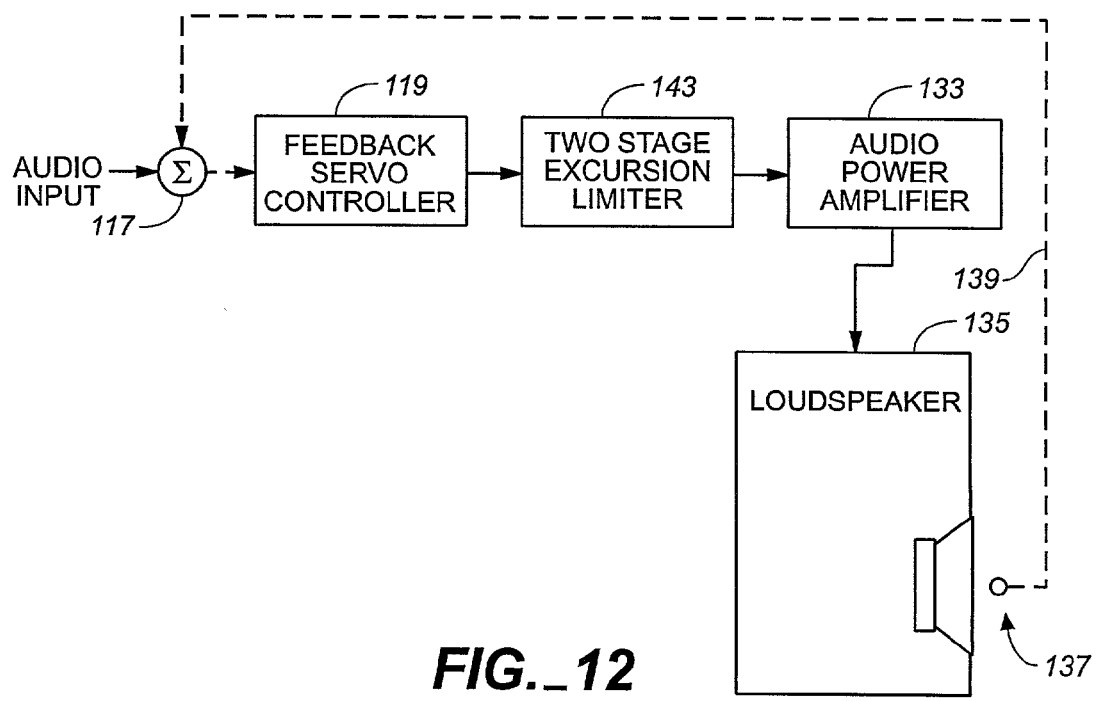
FIG._12

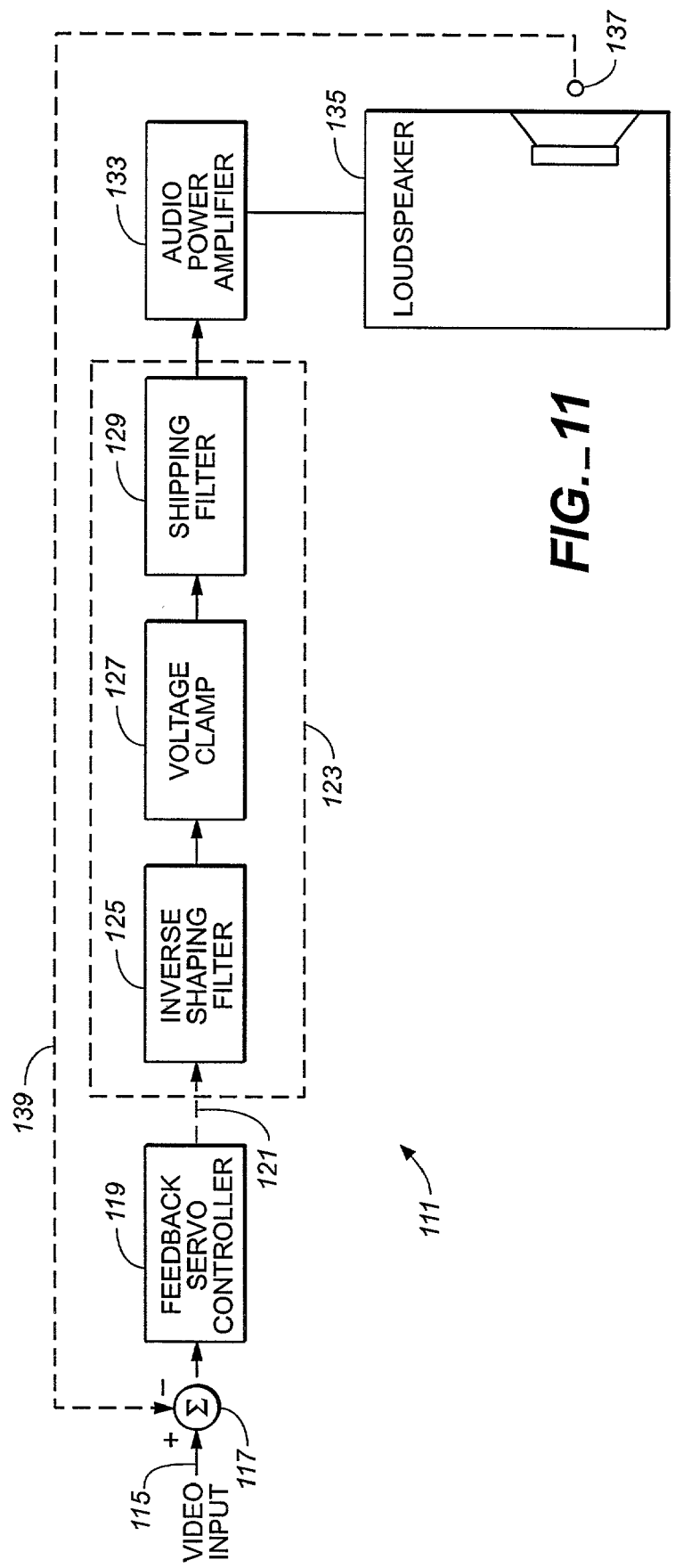
FIG._11

FREQUENCY DEPENDENT EXCURSION LIMITER

CROSS REFERENCE TO RELATED APPLICATIONS

Applicant claims the benefit of provisional application Ser. No. 60/239,013, filed Oct. 6, 2000.

BACKGROUND OF THE INVENTION

The present invention generally relates to the protection of transducers from over excursion, and more particularly relates to circuits and methods for protecting the transducers of audio loudspeakers when used conventionally and within a closed loop system.

The potential for overdriving loudspeakers is a problem that must be taken into account in the design of sound reinforcement systems. Overdriving a loudspeaker can cause damage to the transducers of the loudspeaker system, resulting in degradation or total failure in the performance of the loudspeaker and costly repairs. This problem is made acute by the fact that modern audio power amplifiers are capable of producing output power levels that far exceed the capacity of the loudspeakers to which they are connected. Amplifier output power ratings greater than 1,000 watts rms are common in professional loudspeaker systems, while loudspeaker transducers in such systems are generally capable of handling no more than 100 to 300 watts rms. Although consumer audio systems operate at lower power levels, the power available from consumer amplifiers also commonly exceeds loudspeaker capabilities. To an extent this is necessary, since excess power delivered by the amplifiers produces the brief peaks or spikes in the audio signal needed for audio fidelity. This excess power delivery capability is sometimes referred to as "headroom."

A loudspeaker's power-handling capability is usually specified by its manufacturer, and is specified in watts, a unit of electrical power. Standards organizations such as ANSI, IEC, and AES define methods for measuring the power-handling capability of loudspeakers and provide ratings for continuous pink noise or music power. A system designer uses data developed by these standards to select an amplifier for his or her audio system. Normally, an amplifier is selected having a power rating higher than the loudspeaker rating in order to provide the desired headroom for peak signals. However, without protection, such a system driven beyond the rated capacity of the loudspeaker.

Heretofore, loudspeakers have been protected using signal compressors or limiters in front of the audio amplifier. A compressor is a gain reduction circuit. It is either preset or the audio amplifier output is monitored so that once a voltage threshold is reached, the audio signal level is reduced or maintained to prevent the loudspeaker from receiving power beyond its safe capacity. The degree of protection achieved by this method depends largely on the specifics of the compressor, monitoring, and transducer heating characteristics, and, at best, can only prevent damage to the loudspeaker transducers caused by overheating.

Another failure mechanism is over excursion which can occur without overheating. Loudspeakers have a thermal time constant and require some finite time to heat up when power is applied. Transient peak power for reproducing high fidelity music is of short duration and can be achieved without the average power being in excess of manufacturer ratings. Normally, some choice is made in the design of the loudspeaker system as to the degree or duration of excess power that can be applied safely. However, these decisions are often made without regard to damage that may be caused by over excursion. Over excursion results when maximum peak voltages applied to the loudspeaker cause excess travel of the cone, suspension, and/or other moving parts of the loudspeaker's transducer. This can result in physical damage to the transducer from collision of parts or stress.

Over excursion problems are especially acute with loudspeakers having vented enclosures. In such cases, displacement of the cone of the transducer increases dramatically as frequency is increased below the tuning frequency of the enclosure. One method used to prevent failure from over excursion in such cases is to introduce low-frequency roll-off. However, this approach provides very poor protection, since the end user can overcome the roll-off by increasing signal level. Also, using very steep, ie. high order, low-frequency roll-off filters to combat this problem, results in unacceptable amounts of phase shift and affects audio fidelity. The use of compression limiters is also generally unsuccessful, due to the fact that over excursion protection must provide for instantaneous protection in order to prevent damage. Compression limiters require some amount of time to react and often have poor audio characteristics with fast-attack settings.

One successful approach that has been adopted for protecting a loudspeaker from overexcursion damage is to provide a frequency-dependent excursion limiting circuit for the audio amplifier. Such circuits take advantage of the measured maximum safe peak voltage which can be applied to a loudspeaker in its enclosure as a function of frequency. They use shaping and inverse shaping filters designed to these measured characteristics, in combination with a voltage clamping circuit to prevent the amplifier from driving the loudspeaker past their determined excursion limit at any particular frequency. However, such frequency-dependent excursion limiting circuits have heretofore been used only in open-loop circuits and have required multi-stage circuit elements of relatively high complexity which require the design of carefully matched filters.

The present invention provides an improved frequency-dependent excursion limiter for a loudspeaker system, or other system having a transducer subject to over excursions, which accomplishes the functions of prior art frequency-dependent excursion limiters with a greatly simplified circuit design. The present invention eliminates the need to design matching filters and can be implemented with fewer components. The present invention also has the advantage of being able to operate at lower signal-to-noise ratios and with minimized distortion effects that can be introduced by op amp based circuits. The present invention also contemplates the use of a frequency dependent excursion limiter circuit in a closed loop servo feedback system environment.

SUMMARY OF THE INVENTION

Briefly, the invention is an improved frequency-dependent excursion limiter circuit for protecting the transducers of a loudspeaker system or other system from mechanical overload. The circuit includes an first summing stage for receiving an input signal, a clamping stage following the summing stage for providing a voltage clamping function which limits the voltage of the input signal passed through the clamping stage to a predetermined maximum voltage which is substantially independent of frequency. A shaping filter stage follows the clamping stage and provides a frequency response shaping function based on predetermined frequency response shaping criteria derived from the determined excursion limits of the loudspeaker over a range of frequencies. In accordance with the invention, the shaping filter stage has at least one local feed forward branch filter, the output of which is summed with the output from the clamping stage of the circuit. The circuit further includes an interstage feedback loop for providing feedback from the feed forward branch filter to the summing stage of the circuit. This feedback provides an inverse frequency response shaping function at the summing stage corresponding to the frequency response shaping function of the shaping filter stage. By feeding back the output of the branch filter to the initial summing stage, the required shaping function and inverse shaping function can be produced by a single filter stage, thus eliminating the need for matched filters. The number of circuit elements is also reduced, as is the noise produced by the circuit. Furthermore, eliminating op amp based circuits before clamping reduces the potential for unintendly driving the op amps beyond their rated range. (As noted below, a designer may wish to use the natural clipping features of an op amp to provide a clamping function.)

In a preferred aspect of the invention, the first stage and clamping stage of the circuit are combined into a single clamping stage. This is accomplished by providing the clamping function in a local feedback loop which is summed with the feedback from the shaping filter stage of the circuit.

It is therefore an object of the invention to provide a reduced complexity frequency-dependent excursion limiting circuit to prevent overexcursions in loudspeakers, including loudspeakers in vented enclosures.

It is a further object of the invention to eliminate the need for matched filters in a frequency-dependent limiter circuit.

It is a still further object to minimize the number of circuit elements in a frequency-dependent limiter circuit.

Still further objects of the invention will be apparent from the following specification and claims.

DESCRIPTION OF THE DRAWINGS

FIG. 1 is a cross-sectional view of cone driver of a loudspeaker illustrating a setup for measuring the maximum safe peak voltage of the loudspeaker over a range of frequencies.

FIG. 2 is a block diagram of a test circuit for measuring the maximum safe peak voltage of a loudspeaker over a range of frequencies using the apparatus shown in FIG. 1.

FIG. 3 is a block diagram of a basic prior art series frequency-dependent excursion limiter circuit having separate shaping and inverse shaping filter circuits.

FIG. 4 shows a basic filter circuit topology for approaching the design of the shaping filter of the circuit shown in FIG. 3.

FIG. 5 is a detailed circuit diagram for a shaping filter containing only one individual filter in the input branch of the basic circuit topology shown in FIG. 4.

FIG. 6 is a voltage amplitude versus frequency graph showing a suitable frequency response characteristic of a shaping filter for the plotted maximum safe peak voltage characteristics of the loudspeaker measured by the test circuit shown in FIG. 2.

FIG. 7 is a detailed circuit diagram of an implementation of a frequency-dependent excursion limiting circuit shown in FIG. 3, utilizing matched filters for the shaping filter and inverse shaping filter in accordance with the circuit shown in FIG. 5.

FIG. 8 is a block diagram conceptually showing the improved frequency-dependent excursion limiter circuit of the invention.

FIG. 8A is a detailed circuit diagram of an implementation of the improved frequency-dependent excursion limiter circuit shown in FIG. 8.

FIG. 9 is a block diagram conceptually showing an alternative embodiment of the improved frequency-dependent excursion limiter circuit shown in FIG. 8.

FIG. 9A is a detailed circuit diagram of an implementation of the improved frequency-dependent excursion limiter circuit shown in FIG. 9.

FIG. 10 is an illustrative diagram of a classic negative feedback system.

FIG. 11 is a block diagram showing a frequency-dependent excursion limiter circuit implemented in a closed-loop system.

FIG. 12 is a block diagram showing the improved frequency-dependent excursion limiter circuit implemented in a closed loop system.

DETAILED DESCRIPTION OF THE ILLUSTRATED EMBODIMENT

Referring now to the drawings, FIGS. 1 and 2 illustrate a technique for measuring the maximum safe peak voltage of a loudspeaker transducer within its enclosure in order to develop criteria for designing suitable filters for the improved frequency-dependent excursion limiting circuit of the invention. Such measurement techniques have been practiced in connection with the prior art circuit of FIG. 3 described herein.

In FIG. 1, the transducer of a loudspeaker is shown in the form of a cone driver 11. Also shown is an excursion detector 13 mounted to the front of the cone driver to measure the excursion of the driver's dust cap 15. The excursion detector is comprised of a bridge member 17, suitably be manufactured of a ¼ inch square metal bar, mounted to the rim 19 of the cone driver by means of stand-off posts 21. Bridge member 17 carries two low force contact switches 22, 23 having suitable depth adjustments 25 to adjust the position of the contact switches to a position that correlates with the maximum safe travel (excursion) of the driver cone 26. To provide a safety factor, the contact switch depths are adjusted to a position slightly less than the maximum safe travel (excursion) of the driver cone (suitably 15 to 20 percent less). The maximum safe travel of the cone can be determined by several parameters, including suspension limits and voice-coil and back-plate collision limits, and need not be symmetrical.

It is seen that contact switches 22, 23 detect movement of the driver cone 26 by means of an L-shaped position-indicating element 27, suitably fabricated from a lightweight rigid material, such as a bent segment of steel wire, which is glued to the loudspeaker dust cap 15 for the purpose of taking the measurements. When a single frequency tone is applied to the loudspeaker, the voltage at which the position indicator 27 contacts one or the other of the contact switches 22, 23 will be the maximum safe peak voltage of the loudspeaker at the indicated frequency.

A circuit for measuring maximum safe peak voltage of the loudspeaker 10 in its enclosure 12 over a range of frequencies is shown in FIG. 2. Here, transducer 11 with the excursion detection hardware shown in FIG. 1 is shown mounted in the loudspeaker enclosure. It must be kept in mind that, when measurements are taken, the loudspeaker must be mounted in the enclosure in which it will ultimately be used, since the enclosure will affect the degree of excursion experienced by the driver cone 26.

The circuit in FIG. 2 is comprised of an adjustable sine wave generator 29, ramp generator 31, voltage control amplifier 33, and audio power amplifier 35. The audio power amplifier 35 should be capable of producing a larger peak voltage than the amplifier intended for the final application or design (typically 120 volts peak into four ohms for professional loudspeakers). The ramp generator 31 is connected to the voltage control amplifier 33 to gradually increase the level of the sine wave generated by the sine wave generator 29 from zero volts to its full level. The ramp must be set fast enough to avoid overheating the loudspeaker, but not so fast as to cause transient behavior in the loudspeaker (typically one to two seconds for the amplifier output to reach 100 volts peak). The settings can be adjusted with the loudspeaker initially disconnected. The contact switches are connected to the ramp generator 31 by means of wires 20 to reset and stop the ramp generator when a contact is closed. This contact acts to mute the sine wave feeding the amplifier. An oscilloscope or peak-hold meter 37 connected to the output of the power amplifier is set to capture the maximum peak voltage. By incrementing the sine wave generator in small steps (typically 1/12 octave) across the entire operating frequency band of the loudspeaker, a maximum safe peak voltage can be recorded for each test frequency, preferably with a margin of error factored in as noted above. This process is preferably repeated to verify accuracy and repeatability of the measurement. The measurement data collected is used to design the shaping filters for the improved frequency-dependent excursion limiter circuit of the invention as hereinafter described.

Before describing the improved circuit of the invention, a prior art frequency-dependent excursion limiter circuit design heretofore designed and used is described in reference to FIGS. 3–6. FIG. 3 illustrates a loudspeaker system comprised of loudspeaker 10 having a cone driver 11 powered by an audio power amp 39. A prior art frequency-dependent series excursion limiting circuit 41 is inserted in the signal path between the system's power amp 39 and audio input 43. The excursion limiting circuit is comprised of three signal processing blocks connected in series, which in combination provide the frequency-dependent excursion limiting function. More specifically, excursion limiting function is produced by the series connection of an inverse shaping filter 45, a voltage clamp 47, and a shaping filter 49.

To understand the operation of the excursion limiter circuit 41, it is first understood that the voltage clamp stage 47 of the circuit acts to clamp the audio signal to the same peak voltage at all frequencies whenever the audio input 43 exceeds a certain input level. After the point of clamping, the shaping filter 49 will increase or decrease signal level based on the shaping filter's frequency response characteristics. The voltage at the output of the shaping filter is amplified by the power amplifier 39, which in turn drives the loudspeaker 10. By designing the shaping filter 49 to follow the contour of the loudspeaker's maximum safe voltage throughout all frequencies, as determined by the measurement technique described above, the loudspeaker is protected from overexcursion at every frequency. The inverse shaping filter 45 is introduced in front of the voltage clamp so that, at low signal levels below clamping, the overall frequency response is kept flat. This is achieved by providing filter 45 with a shaping function which is the inverse of the shaping function introduced by shaping filter 49. Thus, the essential inverse shaping filter before the voltage clamp and the shaping filter after the voltage clamp actively cancel each other out at low signal levels.

As above mentioned, the design of the shaping filters is critical to the operability of an excursion limiter circuit such as illustrated in FIG. 3. The technique for designing such shaping filters is now briefly described in reference to FIGS. 4–6.

First, data must be collected on the loudspeaker's maximum safe peak voltage over a specified frequency range. This data can be collected using the measurement techniques described above. Once collected, the shaping filter 49 shown in FIG. 3 is designed to fit within the boundaries of the data, as shown by curve 54 in FIG. 6, taking into account the parameters of the audio amplifier 39 and the voltage clamp 47 to be used in the final design.

The requirements and design of the shaping filter are described in reference to FIGS. 4 and 6. FIG. 4 shows a general circuit topology for the class of filters used as the shaping filter and inverse shaping filter in FIG. 3. The filter design begins by the graphical plotting of the data from the measured maximum safe peak voltage as shown by curve 51 in FIG. 6. Also, a line is drawn on the graph that represents the maximum peak voltage produced by the system's power amplifier 39. This information is represented by the dashed line 53 on the FIG. 6 graph. The criterion that must be met when designing the shaping filter 49 is that the shaping filter's frequency response, when plotted on this graph, must stay below the maximum safe peak voltage curve 51, except where the amplifier peak voltage is already lower than the maximum safe peak voltage. More specifically, the shaping filter's frequency response must be scaled by two linear factors, $k_1$ and $k_2$, prior to plotting this curve, such that:

Plotted Data=$k_1 \cdot k_2 \cdot H(s)$ where $k_1$ represents the voltage gain of the power amplifier 39 used in the loudspeaker system, and $k_2$ represents the peak voltage set by voltage clamp 47. The voltage gain of the power amplifier is either fixed or set to a maximum value if volume controls are incorporated in the amplifier.

H(s) in the above formula represents the frequency response of the entire shaping filter, typically described as a Laplace Transfer function in the S-domain. It can be of any order necessary to meet the criteria stated above, but must contain an equal number of poles and zeroes. The general circuit topology shown in FIG. 4 allows for a filter to be constructed exhibiting any desired frequency response, and has the following transfer function:

$$H = \frac{V_o}{V_i} = -\frac{\frac{1}{R_{io}} + \sum_{n=1}^{\infty} \frac{T_{in}}{R_{in}}}{\frac{1}{R_{fo}} + \sum_{m=1}^{\infty} \frac{T_{fm}}{R_{fm}}}$$

Referring to FIG. 4, Ti represents individual active filter stages 55a, 55b, 55c on the input branch 56 of filter circuit 58, while Tf represents individual active filter stages 57a, 57b, 57c in the filter's feedback branch 59. Any number of filter stages can be used in the input and feedback branches; however, it is desirable to reach the criteria with the minimum number of individual filters, in order to reduce the number of components and to minimize noise and inaccuracies introduced by component tolerances. The individual filters stages Ti and Tf are easiest to implement as second-order sections ("sos"). This allows the filters to be designed from standard low-pass, high-pass, and band-pass type circuits universally expressed as:

$$T_i, T_f = k \cdot \frac{s^2 + \frac{\omega_z}{Q_z}s + \omega_z^2}{s^2 + \frac{\omega_p}{Q_p}s + \omega_p^2}$$

In many implementations, including the circuits described herein, only one individual filter is needed in the input branch of the FIG. 4 circuit topology to meet design criteria. FIG. 5 is a circuit diagram for such a simplified filter that will meet the criteria for the shaping filter 49 in FIG. 3. FIG. 5 shows a second-order high-pass filter in the input branch described by the following formula:

$$T_{iI} = \frac{s^2}{s^2 + \frac{\omega_p}{Q_p}s + \omega_p^2}$$

where $\omega_p$=the corner frequency of the filter and $Q_p$ is the quality factor of the filter. The shaping filter therefore has a frequency response of:

$$H(s) = -\frac{\frac{1}{R_{io}} + \frac{\frac{s^2}{R_{iI}}}{s^2 + \frac{\omega_{iI}}{Q_{iI}} + \omega_{iI}^2}}{\frac{1}{R_{fo}} + 0}$$

It is noted that by eliminating the filters in the feedback branch of the general topology circuit shown in FIG. 4, the term $$\sum_{m=1}^{\infty} \frac{T_{fm}}{R_{fm}}$$

in the transfer function for the general circuit topology of FIG. 4 goes to zero.

Circuit parameters for the filter are chosen by trial and error in reference to the plotted maximum safe peak voltage data in FIG. 6. Choosing circuit parameters for the filter is a matter of designing a shaping filter having a frequency response with scaling which falls below the plotted maximum safe peak voltage data in the region of the graph where the peak voltage data falls below the amplifier's maximum peak voltage. For example, in reference to FIG. 6, by selecting an $\omega_p$=28.3 Hz, and by setting $Q_p$ to 1.3, and choosing the filter component values accordingly, the resulting frequency response of the shaping filter can be plotted on FIG. 6 using appropriate scaling factors. For the curve in FIG. 6, the scaling factors used are 10 v/v for $k_1$ (amplifier voltage gain) and 10.6 $V_{pk}$ for $k_2$ (clamping voltage).

FIG. 7 shows a possible circuit implementation for the excursion limiter circuit 41 shown in FIG. 3 using the single second-order high-pass filter described above. In the FIG. 7 circuit, the shaping filter 49 is comprised of op amps U13, U14 and the surrounding resistor and capacitor components having component values derived from the parameters and equations described above. It is seen that the second-order high-pass filter corresponds to branch filter circuit 55a in the input branch 56 of the general filter topology of FIG. 4, and comprises op amp U13 and RC components C12, C13, R16, and R17. The voltage clamping block 47, in turn, is formed by op amp U12, resistor R15, and Zener diodes D10 and D11. The clamping voltage used is selected from the scaling factor, $k_2$, adopted in generating curve 54 in FIG. 6, and can be set by selecting the appropriate values for Zener diodes D10, D11. The clamping voltage should be set substantially lower than the power supply voltage to prevent other parts of the circuit from clipping first, particularly if any high-Q filters are used. The inverse shaping filter 45, which precedes the voltage clamping block 47, is seen to include op amps U10, U11, and surrounding components. The inverse shaping filter is constructed as a mirror of the shaping filter, with a second-order high-pass individual filter, comprised of op amp U11 and RC components C10, C11, R13, and R14, and would correspond to branch filter 57a in the feedback branch 59 of the general circuit topology of FIG. 4.

To create an inverse shaping filter in the context of the general filter circuit topology of FIG. 4, each of the feedback branch components in the shaping filter, if any, become input branch components in the inverse shaping filter circuit. Conversely, each of the input branch components become feedback branch components. Within these mirror image circuit designs, component matching is essential to produce complete cancellation.

It is noted that the series excursion limiter circuit of FIG. 7 will, at low signal levels, have a flat frequency response and phase response within and outside the audio band, typically to several hundred kHz, provided the components for the shaping and inverse shaping filters are sufficiently matched. Furthermore, since the circuit is flat down to zero Hz, it has been discovered that a circuit of this type can be uniquely inserted inside of a feedback servosystem, as hereinafter described, without affecting the stability of the system. The series excursion limiter circuit of FIG. 7 only affects the signal when signal levels become dangerous to the loudspeaker. (In some circumstances clipping can occur below this level if the op amps are overdriven.) At that point, signal clamping occurs instantaneously, keeping the transducer safe from overexcursion failure. Since the threshold where the signal to the loudspeaker is clamped varies as a function of frequency, the circuit acts as a frequency-dependent excursion limiter.

FIG. 8 is a block diagram conceptually illustrating the improved frequency-dependent excursion limiter of the invention which eliminates the need for the inverse shaping filter shown in FIGS. 3 and 7. The circuit of FIG. 8 greatly reduces the complexity of the circuit, has fewer components, reduces noise, and minimizes the risk that op amp within the circuit will be driven to the point of clipping (most op amps are rated to 12 to 15 volts).

The improved circuit of FIG. 8 includes a first summing stage 60, which incorporates the circuit's clamping function, followed by a shaping filter stage 61. The shaping filter 61 is constructed in the same manner as described in connection with the shaping filter 49 in the series excursion limiter filter of FIG. 3; however, in the improved filter, the design of the shaping filter must be restricted to using input or feed forward branch filters only, that is, filters 55a through 55c of the general filter topology of FIG. 4, without any feedback branch filters (57a through 57c in FIG. 4). It is noted that the block diagram of FIG. 8 shows only one input branch filter 62; however it will be understood that multiple input branch filters (e.g. branch filters 55a, 55b, 55c in FIG. 4) may be used as required by the shaping filter design process, as indicated by additional branch filter 62a shown in dashed lines.

In FIG. 8, it is seen that the output of branch filter 62 is brought back to the summing stage 60 of the circuit as negative feedback 63. At the same time, the clamping function is provided at the summing stage by a voltage clamping circuit 65 inserted in a local feedback loop 67. Thus, the input 69 to the first summing stage 60 is summed with both the output of clamping circuit 65 and feedback 63 from the branch filter 62, with this summation occurring at summing node 71. The output 73 of the summing stage is connected to the input 75 to the shaping filter, and this input from the summing stage is in turn summed with the output of the branch filter circuit 62 at summing node 77.

FIG. 8A shows a detailed circuit diagram for the excursion limiter circuit illustrated in FIG. 8. In FIG. 8A, the op amps U1B and U1C, along with their surrounding components, C1, C2, R4, R5, R6, R7, R8, comprise the shaping filter stage 61 of the circuit. It is seen that this shaping filter stage is identical to the circuit for the shaping filter 49 in FIG. 7. The summing node 77 is provided at the connection of resistors R6, R7 and R8, while op amp U1C provides a buffered output 79 from the shaping filter. The feed forward branch filter 62 is shown as consisting of op amp U1B and its associated RC network, C1, C2, R4, R5. The circuit implementation of the first summing stage 60 consists of op amp U1A, resistors R1, R2, and R3 connected at summing node 71, with the clamping function being provided by voltage clamping circuit 72 comprised of opposing Zener diodes D1, D2 in the feedback loop 67 connected between the output of op amp U1A to its inverted input.

In the circuit implementation of the FIG. 8 excursion limiter, it can be seen that the inverse shaping filter of the prior art excursion limiter circuit shown in FIG. 3 is entirely eliminated. These is achieved by applying feedback 63 from node 1 of the circuit shown in FIG. 8A back to the summing node 71 of the circuit's first stage 60. The function of the inverse shaping filter is performed by the cancellation that occurs at summing node 71. It is noted that resistors R2, R3 in the summing stage must match resistors R6, R7 in the shaping filter stage to allow feedback cancellation to occur. However, these are matched components are relatively few as compared to the matched component requirements of the prior art and involve resistors that are readily available with tight tolerances.

It should be noted that the process of designing the shaping filter stage 51 shown in FIG. 8A is identical to the above-described process for designing the filter circuit 49 in the series circuit of FIG. 7. Again, referring to the general circuit topology shown in FIG. 4, only input branch filters ($Ti_1$, $Ti_2$, . . . through $Ti_n$) can be used. This is because feed forward and feedback are required simultaneously from the same filter.

FIG. 9 shows an alternative embodiment of the improved circuit of FIGS. 8 and 8A, wherein the clamping function is provided in a separate stage in series with the shaping filter. Frequency-dependent excursion limiter circuit 79 is comprised of a first summing stage 81, a clamping stage 83, and a shaping filter stage 85 having a feed forward input branch filter 87. The output of branch filter 87 is fed back via feedback path 89 to the summing stage 81, where it is summed at summing node 91 with the input 93 to the limiter circuit. The output 95 of this first stage is connected to the input 97 of the clamping stage 83, and the output 99 of the clamping stage is in turn connected to input 101 of the shaping filter stage.

The circuit implementation of this block diagram is illustrated in FIG. 9A, where the separate clamping stage 83 is seen to require a separate op amp U12A with associated opposed Zener diodes D10, D11. The requirements of this circuit are otherwise the same, including the requirement that resistors R2, R3, and R6, R8 be matched to allow feedback cancellation to occur.

It will be understood that the functions of the improved excursion limiter circuits illustrated in FIGS. 8 and 9 could be implemented in ways other than by means of the circuits shown in FIGS. 8A and 9A. For example, a designer might take advantage of the natural tendency of an op amp to clip outside its rated linear range to provide the clamping function of the circuit. This could be accomplished at either the initial summing stage of the circuit or in a stage between the summing stage and shaping filter stage. Also, it will be appreciated that the functions of the described circuits could be performed through digital signal processing techniques instead of by an analog circuit.

Closed-Loop Systems

In a further aspect of the invention, the frequency-dependent excursion limiter circuits illustrated in FIGS. 3 and 8, are uniquely employed in a closed-loop system to prevent over excursion damage to a loudspeaker or other transducer. Closed-loop systems are often encountered in loudspeaker design where it is desired to use negative acoustic feedback, or feedback of some other measured loudspeaker parameter, to improve linearity. However, closed-loop systems can present problems, in that, low-frequency roll-off cannot be used inside a loop since it can cause instability due to extra phase shift induced by the roll-off. Furthermore, a feedback system will naturally produce a greater degree of loudspeaker overdrive at low frequencies, since it attempts to compensate for the loss of acoustic output at low frequencies. Therefore, the use of feedback makes a loudspeaker particularly vulnerable to over excursion damage. By employing a frequency-dependent excursion limiter circuit in the closed-loop system, these problems are eliminated.

The application of excursion limiting as herein described can also be applied to protect against overexcursion of other types of transducers. As hereinafter used, the term "transducer" refers to a general class of devices that convert a signal from one form to another, generally electrical current or voltage being one of the signals. A transducer functions as either a sensor or an actuator in a system. A sensor detects some physical quantity and converts it into an electrical signal. For example, a microphone converts acoustic pressure variations into electrical voltage variations. An actuator converts electrical voltage or current into a physical quantity, such as displacement. A loudspeaker functions as an actuator.

Like a loudspeaker, all actuators have various physical limitations, such as how much voltage or current can be applied to them, or how much displacement is allowed. If these quantities are not restricted, damage and failure will occur, similar to that described with loudspeaker transducers.

The classical closed-loop control system illustrated in FIG. 10 helps demonstrate the difficulty of protecting transducers from overload damage. In FIG. 10, G(f) represents some device or system to be controlled or linearized. An actuator 103, shown as an arbitrary device, is combined with a sensor 105 to comprise a plant 107. A servo controller 109 is placed in front of the plant 107 to allow control of the loop for some desired overall purpose. Negative feedback is applied to an input summing node 110 so that the resulting input-output relationship becomes:

$$\text{Output} = \text{Input}\left(\frac{G(f) \cdot H(f)}{1 + G(f) \cdot H(f)}\right)$$

The plant and controller responses vary with frequency (f) and these variables are essential to designing a system that is stable with feedback.

The utility of a feedback system is further understood by realizing that the actuator by itself is an imperfect, non-linear device that does not respond properly to an applied input. If an accurate sensor is coupled to the actuator, the output can be made to respond nearly exactly to the input if H(f) is made to be a very large number, in other words, very high gain. This is demonstrated in the above equation by the fact that, as H(f) grows larger, the equation approaches Output=Input. This eliminates the frequency response errors and non-linearities of the actuator. In practice, the value of H(f) is limited for stability; however, it is still often quite large.

The presence of high gain from H(f) worsens the problem of overloading (and over-excurting) the actuator 103. If the output of the sensor stops tracking the input (as occurs under a variety of maximum conditions), the signal coming out of the summer 110 grows and becomes amplified by the controller. This causes the signal at the input of the actuator to easily overload, potentially even at low system input levels. This is particularly true when the system is operated below its unusable frequency band. Low-frequency roll-off cannot be placed in front of the actuator, as this will introduce phase shift and cause instability. Similarly, phase shift and hence instability will occur if the frequency response of H(f) changes too rapidly. Since H(f) must have high gain in the frequency band of interest, it inevitably still has gain outside the band where overexcursion is more likely. This is where the need arises for an excursion limiter function that exhibits a flat frequency and phase response.

FIG. 11 shows a series frequency-dependent excursion limiter circuit, such as previously used in open-loop systems, employed in a closed-loop audio feedback system. Referring to FIG. 11, the closed-loop system 113 includes an audio input 115 and input summing node 117 for receiving the audio input and passing it to a feedback servo controller 119. The output 121 of the feedback servo controller is connected to the series frequency-dependent excursion limiting circuit 123, which consists of inverse shaping filter 125 followed by a voltage clamp circuit 127 and shaping filter 129. (Excursion limiter circuit 123 is identical in its conceptual block form to the prior art series excursion limiter circuit illustrated in FIG. 3.) The output 131 of excursion limiter circuit is connected to audio power amplifier 133, which is in turn connected to loudspeaker 135 having an acoustic feedback sensor in the form of microphone 137. The acoustic feedback is fed back to summing node 117 of the feedback circuit through the negative feedback loop 139.

By placing the frequency-dependent excursion limiter circuit 123 in the feedback loop, as illustrated in FIG. 11, over excursions of the transducer of loudspeaker 135 are prevented without adding instabilities to the closed-loop system.

FIG. 12 illustrates a similar feedback circuit, wherein the two stage improved frequency-dependent excursion limiter circuit of the invention described in FIG. 8 is inserted in the closed-loop system in place of the series excursion limiting circuit shown in FIG. 11. In this version servo controller 119 is followed by the two stage excursion limiter of FIG. 8, the output of which is connected to audio amplifier 133 which powers loudspeaker 135. As in the closed loop system of FIG. 11, servo control is provided by acoustic feedback from microphone 137 brought back to input summing node 117 via feedback path 139. In this embodiment, the inverse shaping filter of the series excursion limiter circuit shown in FIG. 11 has been eliminated, while maintaining the stability of the closed loop system.

While the present invention has been described in considerable detail in foregoing specification, it shall be understood the it is not intended that the invention by limited to such detail, except as necessitated by the following claims.

What I claim is:

1. An improved frequency dependent excursion limiter circuit for protecting transducers from mechanical overload, said excursion limiter circuit comprising
    a summing stage for receiving a input signal,
    a clamping stage following said summing stage for providing a voltage clamping function which limits the voltage of the input signal passed through said clamping stage to a predetermined maximum voltage substantially independent of frequency, said clamping stage having a clamping stage output,
    a shaping filter stage following said clamping stage, said shaping filter stage providing a frequency response shaping function based on a predetermined frequency response shaping criteria, and including at least one local feed forward branch filter having a feed forward branch filter output summed with said clamping stage output, and
    an inter-stage feedback loop for providing feedback from the branch filter of said shaping filter stage to said summing stage for providing an inverse frequency response shaping function at said summing stage.

2. The improved frequency dependent excursion limiter circuit of claim 1 wherein said summing stage and said clamping stage are combined in a single stage.

3. The improved frequency dependent excursion limiter circuit of claim 2 wherein clamping function at said summing stage is provided by local feedback which is summed with the feedback from the branch filter of said shaping filter stage.

4. The improved frequency dependent excursion limiter circuit of claim 1 wherein the feed forward branch filter of said shaping filter stage is an at least second order filter.

5. The improved frequency dependent excursion limiter circuit of claim 1 wherein said shaping filter stage includes more than one local feed forward branch filter each having a feed forward branch filter output summed with said clamping stage output to provide a desired frequency response shaping function, and wherein said inter-stage feedback loop provides feedback from the more than one branch filters of said shaping filter stage to said summing stage for providing an inverse frequency response shaping function at said summing stage.

6. The improved frequency dependent excursion limiter circuit of claim 1 within said summing stage, clamping stage, and shaping filter stage are op amp based circuits.

7. An improved frequency dependent excursion limiter circuit for protecting transducers from mechanical overload, said excursion limiter circuit comprising a summing stage for receiving a input signal, said summing stage including a clamping circuit for providing a voltage clamping function which limits the voltage of the input signal passed through said summing stage to a predetermined maximum voltage substantially independent of frequency, said summing stage having a summing stage output, a shaping filter stage following said summing stage, said shaping filter stage providing a frequency response shaping function based on a predetermined frequency response shaping criteria, and including at least one local feed forward branch filter having a feed forward branch filter output summed with said summing stage output, and an inter-stage feedback loop for providing feedback from the branch filter of said shaping filter stage to said summing stage for providing an inverse frequency response shaping function at said summing stage which is the inverse of the frequency response shaping function provided by said shaping filter stage.

8. The improved frequency dependent excursion limiter circuit of claim 7 said summing stage includes a local feedback circuit providing local feedback which is summed with the feedback from the branch filter of said shaping filter stage, and wherein the said clamping circuit is inserted in said local feedback circuit.

9. The improved frequency dependent excursion limiter circuit of claim 8 wherein said clamping circuit is comprised of opposed series connected Zener diodes in said local feedback circuit.

10. The improved frequency dependent excursion limiter circuit of claim 7 wherein the feed forward branch filter of said shaping filter stage is an at least second order filter.

11. The improved frequency dependent excursion limiter circuit of claim 10 wherein said shaping filter stage includes more than one local feed forward branch filter each having a feed forward branch filter output summed with said clamping stage output to provide a desired frequency response shaping function, and wherein said inter-stage feedback loop provides feedback from the more than one branch filters of said shaping filter stage to said summing stage for providing an inverse frequency response shaping function at said summing stage.

12. An improved frequency dependent excursion limiter circuit for protecting transducers from mechanical overload, said excursion limiter circuit comprising a summing stage having an summing stage input, a summing stage output, a summing stage summing node, and a voltage clamping circuit for clamping the voltage at the summing stage output at a predetermined clamping voltage level, a shaping filter stage having a shaping filter stage input connected to the output of said summing stage, and further having a shaping filter stage output, a shaping filter stage summing node, and a local feed forward circuit from said shaping filter stage input to said shaping filter stage summing node, said shaping filter stage including at least one branch filter having a branch filter output in the feed forward circuit of said shaping filter stage, said shaping filter stage being designed to provide a frequency response shaping function based on a predetermined frequency response shaping criteria related to the frequency dependent excursion limits of the transducers being protected, and an inter-stage feedback circuit connected from the branch filter output of the branch filter of said shaping filter stage to the input summing node of said summing stage for providing feedback to the summing stage for providing an inverse frequency response shaping function at the summing stage which is the inverse of the frequency response shaping function provided by said shaping filter stage.

13. The improved frequency dependent excursion limiter circuit of claim 12 wherein said shaping filter stage includes more than one local feed forward branch filter each having a feed forward branch filter output summed with said summing stage output to provide a desired frequency response shaping function, and wherein said inter-stage feedback loop provides feedback from the more than one branch filters of said shaping filter stage to the input summing node of said summing stage for providing an inverse frequency response shaping function at said summing stage.

14. The improved frequency dependent excursion limiter circuit of claim 12 wherein the feed forward branch filter of said shaping filter stage is an at least second order filter.

15. The improved frequency dependent excursion limiter circuit of claim 12 wherein said summing stage and shaping filter stage are op amp based circuits.

16. An improved frequency dependent excursion limiter circuit for protecting transducers from mechanical overload, said excursion limiter circuit comprising a summing stage having an summing stage input, a summing stage output, and a summing stage summing node, a clamping stage following said summing stage for providing a voltage clamping function which limits the voltage of the input signal passed through said clamping stage to a predetermined maximum voltage substantially independent of frequency, said clamping stage having a clamping stage output, a shaping filter stage having a shaping filter stage input connected to the output of said summing stage, and further having a shaping filter stage output, a shaping filter stage summing node, and a local feed forward circuit from said shaping filter stage input to said shaping filter stage summing node, said shaping filter stage including at least one branch filter having a branch filter output in the feed forward circuit of said shaping filter stage, said shaping filter stage being designed to provide a frequency response shaping function based on a predetermined frequency response shaping criteria related to the frequency dependent excursion limits of the transducers being protected, and an inter-stage feedback circuit connected from the branch filter output of the branch filter of said shaping filter stage to the input summing node of said summing stage for providing feedback to the summing stage for providing an inverse frequency response shaping function at the summing stage which is the inverse of the frequency response shaping function provided by said shaping filter stage.

17. A method for protecting transducers from mechanical overload from a driving signal comprising providing an input for the driving signal, clamping the driving signal to a predetermined maximum voltage which is substantially independent of frequency if said driving signal exceeds said predetermined maximum voltage, after clamping, passing the driving signal through a shaping filter stage which provides a frequency response shaping function based on a predetermined frequency response shaping criteria related to the frequency dependent excursion limits of the transducers being protected from mechanical overload, and providing feedback from the shaping filter stage to the driving signal input to provide an inverse frequency response shaping function at said input which is the inverse of the frequency response shaping function provided by said shaping filter stage.

18. The method of claim 17 wherein signal clamping is provided at said driving signal input.

19. The method of claim 17 wherein signal clamping is provided by local feedback at said driving signal input.

20. The method of claim 17 wherein said driving signal input and signal clamping are provided in separate stages of a circuit.

21. The method of claim 17 wherein said shaping filter stage is includes at least one feed forward branch filter having a branch filter output fed back to the driving signal input.

22. The method of claim 21 wherein the feed forward branch filter of said shaping filter stage is an at least second order filter.

23. The method of claim 21 wherein said shaping filter stage includes more than one local feed forward branch filter each having a feed forward branch filter output fed back to the driving signal input.

* * * * *